(12) United States Patent
Cheng et al.

(10) Patent No.: US 8,563,385 B2
(45) Date of Patent: Oct. 22, 2013

(54) FIELD EFFECT TRANSISTOR DEVICE WITH RAISED ACTIVE REGIONS

(75) Inventors: Kangguo Cheng, Schenectady, NY (US); Bruce B. Doris, Brewster, NY (US); Ali Khakifirooz, Mountain View, CA (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/606,382

(22) Filed: Sep. 7, 2012

(65) Prior Publication Data

US 2013/0071979 A1    Mar. 21, 2013

Related U.S. Application Data

(63) Continuation of application No. 13/237,319, filed on Sep. 20, 2011.

(51) Int. Cl.
*H01L 21/336* (2006.01)

(52) U.S. Cl.
USPC ........... 438/300; 438/301; 257/377; 257/381; 257/385

(58) Field of Classification Search
USPC ............... 438/300, 301; 257/377, 381, 385, 257/E29.267, E29.269
See application file for complete search history.

(56) References Cited

U.S. PATENT DOCUMENTS

| | | | |
|---|---|---|---|
| 5,079,180 A | 1/1992 | Rodder et al. | |
| 6,323,525 B1 * | 11/2001 | Noguchi et al. | 257/385 |
| 6,495,900 B1 | 12/2002 | Mouli et al. | |
| 6,633,070 B2 | 10/2003 | Miura et al. | |
| 7,211,458 B2 | 5/2007 | Ozturk et | |
| 2001/0045608 A1 | 11/2001 | Tseng et al. | |
| 2008/0128748 A1 * | 6/2008 | Iinuma | 257/190 |
| 2008/0258218 A1 | 10/2008 | Morita et al. | |
| 2010/0252868 A1 | 10/2010 | Allen et al. | |

* cited by examiner

*Primary Examiner* — Theresa T Doan
(74) *Attorney, Agent, or Firm* — Cantor Colburn LLP; Vazken Alexanian

(57) ABSTRACT

A method for fabricating a field effect transistor device includes forming a gate stack on a substrate, forming a spacer on the substrate, adjacent to the gate stack, forming a first portion of an active region on the substrate, the first portion of the active region having a first facet surface adjacent to the gate stack, forming a second portion of the active region on a portion of the first portion of the active region, the second portion of the active region having a second facet surface adjacent to the gate stack, the first facet surface and the second facet surface partially defining a cavity adjacent to the gate stack.

17 Claims, 4 Drawing Sheets

FIELD EFFECT TRANSISTOR DEVICE WITH RAISED ACTIVE REGIONS

CROSS-REFERENCE TO RELATED APPLICATIONS

This is a continuation application of and claims priority from U.S. application Ser. No. 13/237,319, filed on Sep. 20, 2011, the entire contents of which are incorporated herein by reference.

FIELD OF INVENTION

The present invention relates generally to field effect transistor (FET) devices, and more specifically, to FET devices with raised active (source and drain) regions.

DESCRIPTION OF RELATED ART

Typical FET devices include a gate stack portion that includes a metallic and/or high-k dielectric layer and a capping layer disposed on a silicon on insulator (SOI) portion of a substrate. Active regions that include dopants may be formed in the substrate. Often a silicide material is formed on the active region to improve conductivity between the active regions and conductive contacts that contact the active regions.

Raised source/drain (RSD) FET devices include active regions that are often grown using an epitaxial growth process to form doped source and drain regions on the substrate adjacent to the gate stack. The use of RSD in FET devices often desirably reduces the resistance in the active regions. The RSD may also be used to form a shallow junction with the channel region of the FET device when the substrate includes a relatively thick SOI layer. The use of RSD in this regard may control short-channel effect in the FET device.

As the pitch or scale of FET devices is reduced, the channel length and the distance between the active regions of the RSD are reduced, and may induce an undesirable parasitic resistance in a FET device.

BRIEF SUMMARY

According to one embodiment of the present invention, a method for fabricating a field effect transistor device includes forming a gate stack on a substrate, forming a spacer on the substrate, adjacent to the gate stack, forming a first portion of an active region on the substrate, the first portion of the active region having a first facet surface adjacent to the gate stack, forming a second portion of the active region on a portion of the first portion of the active region, the second portion of the active region having a second facet surface adjacent to the gate stack, the first facet surface and the second facet surface partially defining a cavity adjacent to the gate stack.

According to another embodiment of the present invention, a method for fabricating a field effect transistor device includes forming a gate stack on a substrate, forming a first spacer on the substrate, adjacent to the gate stack, forming a first portion of an active region on the substrate, the first portion of the active region having a first facet surface adjacent to the gate stack, forming a second portion of the active region on a portion of the first portion of the active region, the second portion of the active region having a second facet surface adjacent to the gate stack, the first facet surface and the second facet surface partially defining a cavity adjacent to the gate stack, and forming a second spacer on the second portion of the active region adjacent to the first spacer.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIG. 1 illustrates a side partially cut-away view of an exemplary embodiment of a gate stack 101 that is disposed on a substrate;

FIG. 2 illustrates the resultant structure following the formation of spacers on the SOI layer;

FIG. 3 illustrates the resultant structure following the formation of first portions of RSD active regions;

FIG. 4 illustrates the resultant structure following the formation of second portions of RSD active regions; and FIG. 5 illustrates the resultant structure of an exemplary embodiment of a FET device following the formation of a silicide material.

FIG. 6 illustrates the resultant structure following the formation of spacers; and FIG. 7 illustrates the resultant FET device following the formation of silicide material.

DETAILED DESCRIPTION

A field effect transistor (FET) device having a raised source/drain (RSD) may induce an undesirable parasitic capacitance in the FET device due to the proximity of the RSD active regions. Previous methods for reducing the parasitic capacitance in a FET device include forming an RSD having a faceted surface in a region adjacent to the gate stack that is covered with a wide spacer material. The faceted surface in the region adjacent to the gate stack reduces parasitic capacitance; however, the wide spacer material reduces the surface area of subsequently formed silicide material on the exposed surfaces of the RSD. The reduced surface area of the silicide material undesirably increases the resistance of the RSD. The methods and resultant devices described below reduce parasitic capacitance due to RSD regions while providing an efficient silicide region to maintain a desired resistance in the RSD regions.

Figure 1:
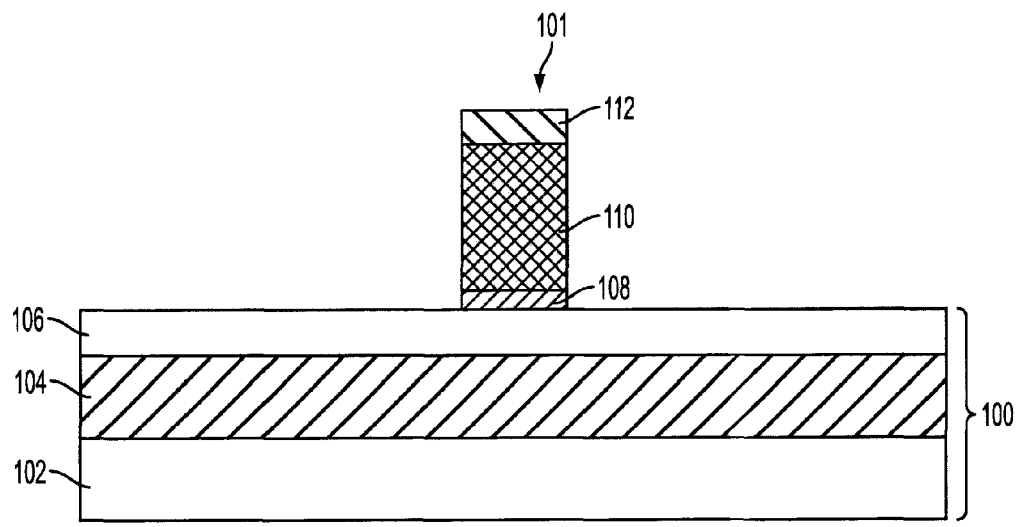
FIGS. 1-5 illustrate an exemplary method for forming a FET device with a RSD region. In this regard.

In this regard, FIGS. 1-5 illustrate an exemplary method for forming a FET device with a RSD region. FIG. 1 illustrates a side partially cut-away view of an exemplary embodiment of a gate stack 101 that is disposed on a substrate 100. The substrate 100 includes a bulk silicon layer 102, a buried oxide (BOX) layer 104, and a silicon on insulator (SOI) layer 106. In the illustrated embodiment, the gate stack 101 is disposed on the SOI layer 106 of the substrate 100. The gate stack 101 of the illustrated exemplary embodiment includes a gate dielectric portion 108 disposed on the SOI layer 106, a gate conductor portion 110 disposed on the gate dielectric portion 108, and a hardmask portion 112 disposed on the gate conductor portion 110. The gate dielectric portion 108 may include any suitable gate material such as, for example, a metallic material and/or a high-k dielectric material or layers of materials. The gate conductor portion 110 may include, for example, a polysilicon material. The hardmask portion 112 may include, for example, an oxide or nitride material. The gate stack 101 may be formed by any suitable gate fabrication process. In the illustrated example, the gate stack 101 is formed by deposition, lithographic patterning and etching process.

Figure 2:
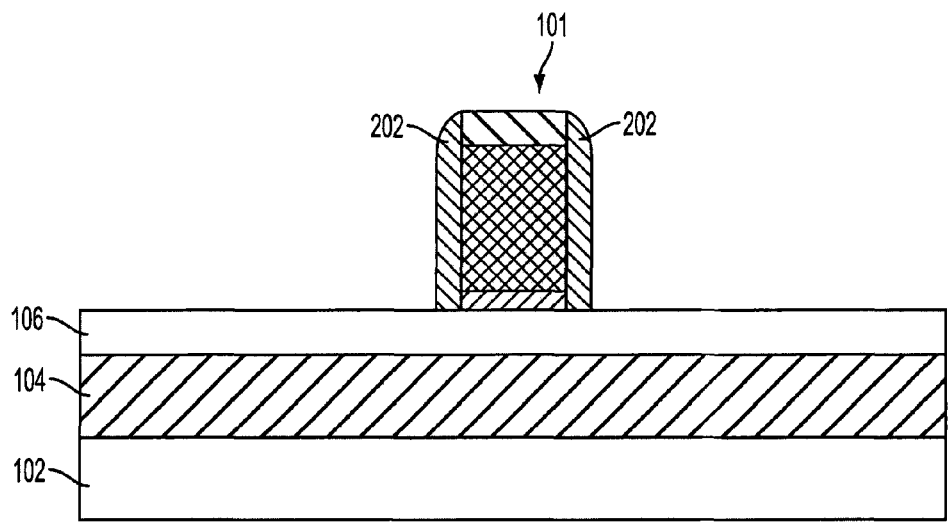

FIG. 2 illustrates the resultant structure following the formation of spacers 202 on the SOI layer 106 adjacent to the sidewalls of the gate stack 101. The spacers 202 may include any suitable dielectric material such as, for example, an oxide or nitride material. The spacers 202 may be formed by, for example, a deposition and etching process that may include a plasma enhanced chemical vapor deposition (PECVD) or a chemical vapor deposition (CVD) process followed by an etching process such as a reactive ion etching (RIE) process.

Figure 3:
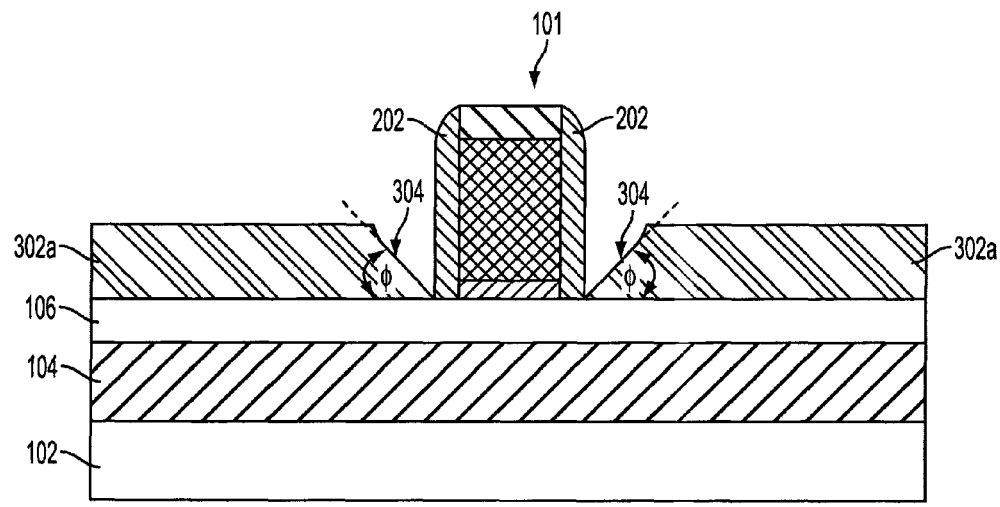

FIG. 3 illustrates the resultant structure following the formation of first portions of RSD active regions 302a formed with an epitaxial growth process. The RSD active regions 302a are grown on the SOI layer 106 and are formed using an epitaxial growth and etching cycle that forms first facet surfaces 304 adjacent to the gate stack 101. The first facet surfaces 304 define an angle ($\phi$) relative to the SOI layer 106.

For a pFET device, the RSD active region 302 material may include insitu boron doped SiGe. Alternatively, the RSD material may include doped Si or Si or SiGe that is doped with implantation following growth. For implantation, the RSD is doped using conventional implantation of B (boron), BF2 or another p-type dopant. For an nFET device the RSD active region 302 material may include insitu phosphorus doped Si or SiC. Alternatively, the material may include Si or SiC that is doped with implantation following growth.

The facet surfaces 304 and 404 (described below in FIG. 4) may be formed during the epitaxial growth process. The epitaxial growth process may be divided into two processes that are performed in cycle, a growth process and an etch process. The deposition and etch processes are repeated in a cyclical manner to grow the raised-source drain. The etch portion removes nuclei from dielectric surfaces to ensure selectivity. That is to maintain silicon growth on silicon surfaces and while preventing or removing silicon from the dielectric surfaces. By adjusting the duration of the etch and deposition portions of the cycle, the raised source drain may be made facetted or non facetted. More specifically, when the etch portion of the cycle is increased in duration relative to the deposition portion of the cycle then the facet forms. If the deposition portion of the cycle is increased relative to the etch portion of the cycle then no facet is formed.

Figure 4:
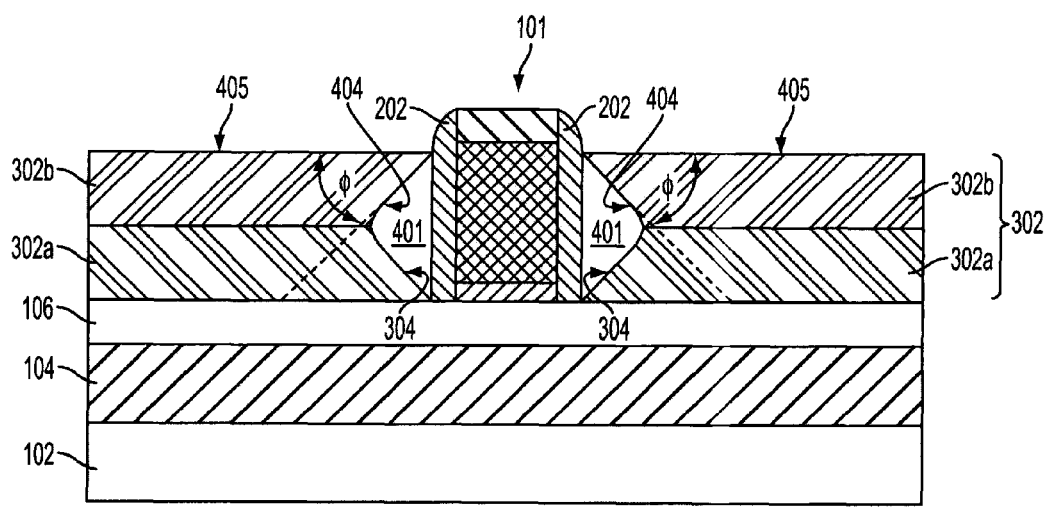

FIG. 4 illustrates the resultant structure following the formation of second portions of RSD active regions 302b that with the first portions of RSD active regions 302a define the RSD active regions 302. The second portions of RSD active regions 302b are grown using an epitaxial growth process similar to the process described above from the exposed horizontal surfaces of the first portions of RSD active regions 302a, such that second facet surfaces 404 are formed that correspond to the first facet surfaces 304. The second facet surfaces 404 define an angle that is approximately $\phi$ relative to the top or exposed surface 405 of the RSD active regions 302. The first facet surfaces 304 and the second facet surfaces 404 partially define cavities or voids 401 adjacent to the gate stack 101 or the spacers 202. The RSD active regions 302 may be doped with ions during the epitaxial growth processes (in-situ), or may be exposed to ions that may be implanted in the RSD active regions 302 to form source and drain regions.

Figure 5:
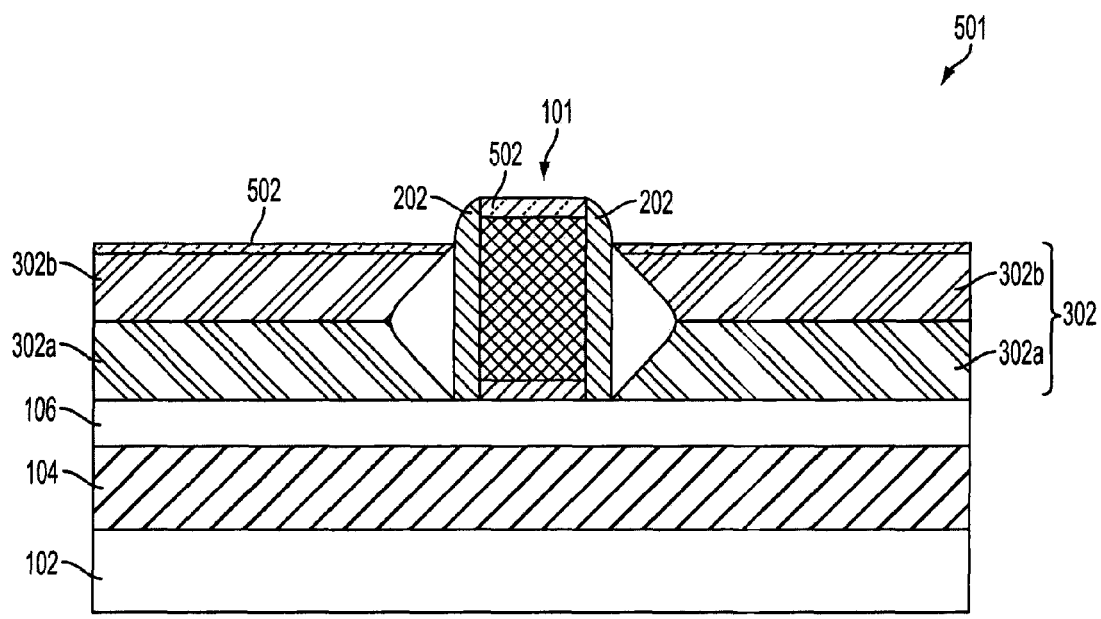

FIG. 5 illustrates the resultant structure of an exemplary embodiment of a FET device 501 following the formation of a silicide material 502 over the exposed horizontal surfaces of the RSD active regions 302. The hardmask portion 112 (of FIG. 1) may be removed, and a silicide material 502 may be formed on the gate conductor portion 110. The silicide material 502 may be formed by any suitable process such as, for example, depositing a layer of metallic material over the exposed silicon and polysilicon materials and annealing to form the silicide material 502. Following the formation of the silicide material 502, conductive contacts (not shown) may be formed on the silicide material 502.

Figure 6:
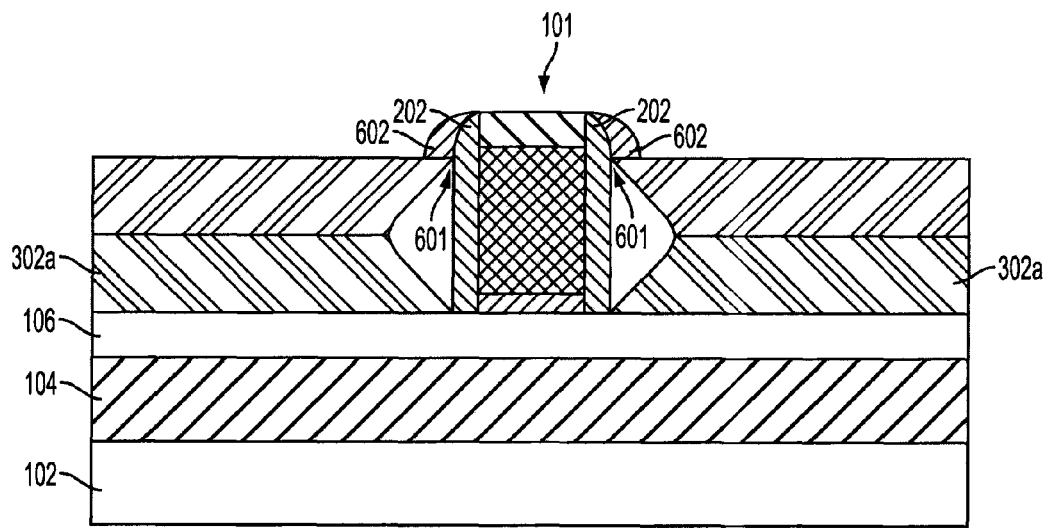
FIGS. 6-7 illustrate an alternate exemplary method for fabricating a FET device. In this regard.
Figure 7:
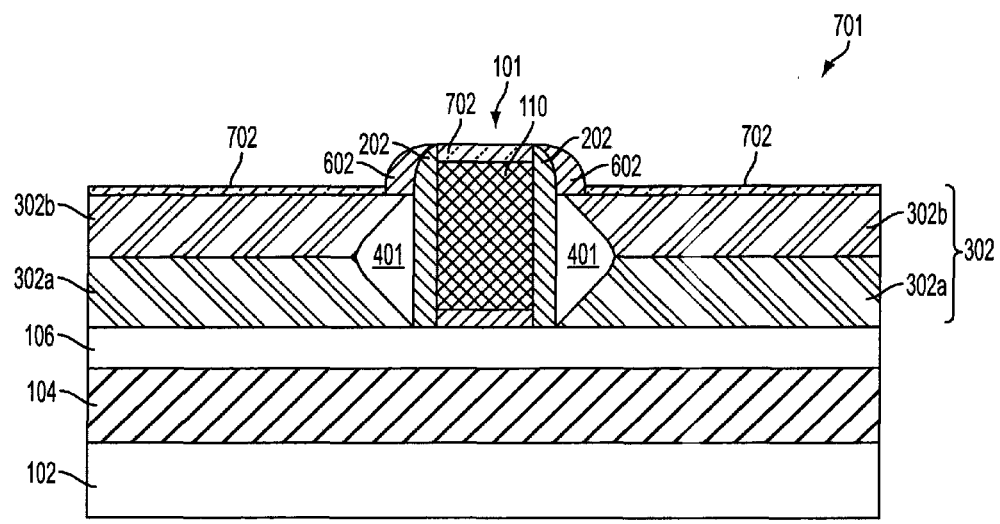

FIGS. 6-7 illustrate an alternate exemplary method for fabricating a FET device. In this regard, FIG. 6 illustrates the resultant structure following the formation of spacers 602 adjacent to the spacers 202 on the second portions of RSD active regions 302b following the formation of the second portions of RSD active regions 302b (as described above in FIG. 4). The spacers 602 may be formed using any suitable process including, for example, a deposition and etching process similar to the process described above for the formation of the spacers 202. The spacers 602 may include any suitable material, such as, for example, an oxide or nitride material. The spacers 602 may be formed to obscure gaps 601 defined by the spacer 202 and the second portions of RSD active regions 302b.

FIG. 7 illustrates the resultant FET device 701 following the formation of silicide material 702 over exposed horizontal surfaces of the RSD active regions 302 and the gate conductor portion 110 using a similar process as described above in FIG. 5.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method for fabricating a field effect transistor device, the method comprising:

forming a gate stack on a substrate;

forming a spacer on the substrate, adjacent to the gate stack;

forming a first portion of an active region on the substrate, the first portion of the active region having a first facet surface adjacent to the gate stack;

forming a second portion of the active region on a portion of the first portion of the active region, the second portion of the active region having a second facet surface adjacent to the gate stack, the first facet surface and the second facet surface partially defining an enclosed cavity adjacent to the gate stack, wherein a bottom surface of the first portion is in contact with the first spacer and a top surface of the first portion is spaced away from the first spacer, and wherein a bottom surface of the second portion is spaced away from the first spacer and a top surface of the second portion is in contact with the first spacer.

2. The method of claim 1, wherein the first portion of the active region is formed with an epitaxial growth process.

3. The method of claim 1, wherein the second portion of the active region is formed with an epitaxial growth process.

4. The method of claim 1, further comprising forming a silicide material on portions of the second portion of the active region, the silicide material also in contact with the first spacer.

5. The method of claim 1, wherein the first facet surface defines an angle relative to the substrate.

6. The method of claim 1, wherein the second facet surface defines an angle relative to an exposed surface of the second portion of the active region.

7. The method of claim 1, wherein the substrate includes a silicon material.

8. The method of claim 1, further comprising forming a silicide material on a portion of the gate stack.

9. A method for fabricating a field effect transistor device, the method comprising:

forming a gate stack on a substrate;

forming a first spacer on the substrate, adjacent to the gate stack;

forming a first portion of an active region on the substrate, the first portion of the active region having a first facet surface adjacent to the gate stack;

forming a second portion of the active region on a portion of the first portion of the active region, the second portion of the active region having a second facet surface adjacent to the gate stack, the first facet surface and the second facet surface partially defining an enclosed cavity adjacent to the gate stack; and forming a second spacer on the second portion of the active region adjacent to the first spacer, wherein a bottom surface of the first portion is in contact with the first spacer and a top surface of the first portion is spaced away from the first spacer, and wherein a bottom surface of the second portion is spaced away from the first spacer and a top surface of the second portion is in contact with the first spacer.

10. The method of claim 9, wherein the first portion of the active region is formed with an epitaxial growth process.

11. The method of claim 9, wherein the second portion of the active region is formed with an epitaxial growth process.

12. The method of claim 9, further comprising forming a silicide material on portions of the second portion of the active region, the silicide material also in contact with the first spacer.

13. The method of claim 9, wherein the first facet surface defines an angle relative to the substrate.

14. The method of claim 9, wherein the second facet surface defines an angle relative to an exposed surface of the second portion of the active region.

15. The method of claim 9, wherein the substrate includes a silicon material.

16. The method of claim 9, further comprising forming a silicide material on a portion of the gate stack.

17. The method of claim 9, wherein a bottom surface of the second spacer is disposed on the top surface of the second portion of the active region.

\* \* \* \* \*